United States Patent
Sohn

(10) Patent No.: US 6,937,503 B2
(45) Date of Patent: Aug. 30, 2005

(54) 1T1C SRAM

(75) Inventor: Jeong-Duk Sohn, Pleasanton, CA (US)

(73) Assignee: Zmos Technology, Inc., Sunnyvale, CA (US)

(*) Notice: Subject to any disclaimer, the term of this patent is extended or adjusted under 35 U.S.C. 154(b) by 0 days.

(21) Appl. No.: 10/892,522

(22) Filed: Jul. 14, 2004

(65) Prior Publication Data

US 2005/0024924 A1 Feb. 3, 2005

Related U.S. Application Data

(60) Provisional application No. 60/487,508, filed on Jul. 14, 2003.

(51) Int. Cl.[7] .............................. G11C 11/24
(52) U.S. Cl. .................. 365/149; 365/222; 365/154
(58) Field of Search .................. 365/149, 222, 365/154

(56) References Cited

U.S. PATENT DOCUMENTS 6,275,437 B1 * 8/2001 Kim et al. ................ 365/222
6,646,944 B2 * 11/2003 Shimano et al. ......... 365/149
6,826,106 B2 * 11/2004 Chen ........................ 365/222

* cited by examiner

Primary Examiner—Huan Hoang
(74) Attorney, Agent, or Firm—John P. O'Banion

(57) ABSTRACT

Memory circuits and methods are described providing an interface with high density dynamic memory (DRAM), such 1T1C (1 transistor and 1 capacitor) memory cells, providing full compatibility with static memory (SRAM). The circuitry overcomes the shortcomings with DRAM, such as associated with the restore and refresh operations, which have prevented full utilization of DRAM cores with SRAM compatible devices. The circuit can incorporate a number of inventive aspects, either singly or more preferably in combination, including a pulsed word line structure for limiting the maximum page mode cycle time, an address duration compare function with optional address buffering, and a late write function wherein the write operation commences after the write control signals are disabled.

27 Claims, 11 Drawing Sheets

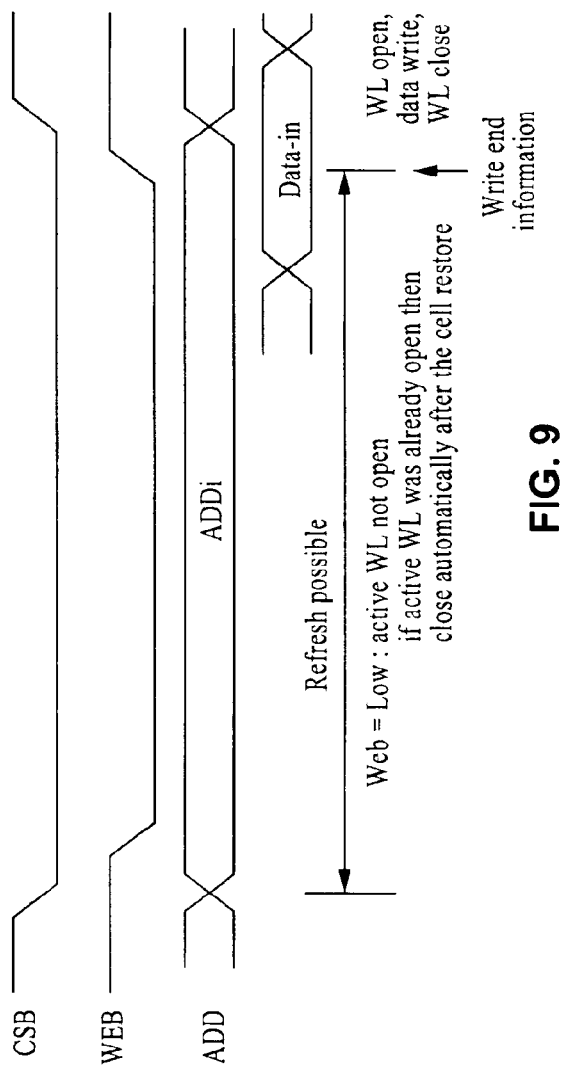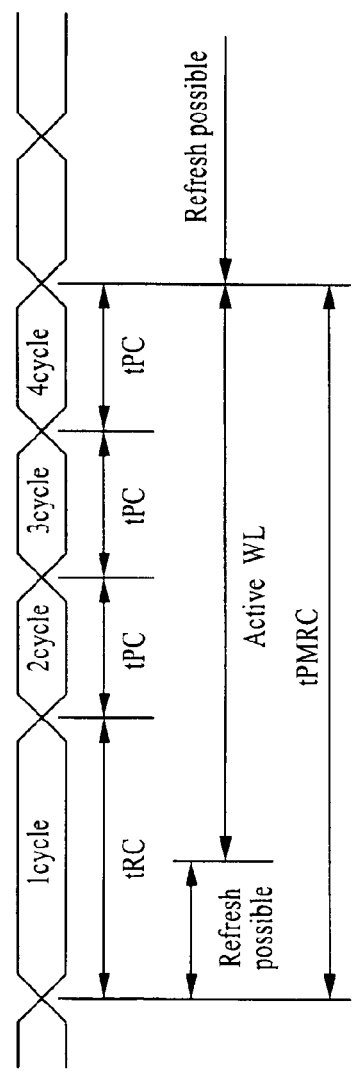

1T1C SRAM

CROSS-REFERENCE TO RELATED APPLICATIONS

This application claims priority from U.S. provisional application Ser. No. 60/487,508 filed on Jul. 14, 2003, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

This invention pertains generally to semiconductor memory, and more particularly to dynamic memory having a static memory interface.

2. Description of Related Art

Static random access memory (SRAM) circuits provide high speed data access while retaining data as long as power is retained on the circuit. Static RAM cell structures, however, typically require at least six transistors which limit the number of memory cells which can be fabricated on a die of a given size.

Dynamic RAM (DRAM), on the other hand, can be very densely packed because only a single transistor and capacitor is required per memory cell. However, dynamic RAM requires additional support circuitry and has other characteristics which limit its use. For example, the access time of the fastest dynamic memory is typically much slower than for fast static memory, since reading the state of the cell requires a period of time to allow sufficient charge from the small storage capacitance to be stored on the capacitance of the read circuit. In addition, reading from dynamic memory is destructive, wherein a write, or restore, operation must follow each read operation. Furthermore, periodic refreshing of the cell states is required so that data is not lost in response to leakage currents changing the stored voltage value. These restore and refresh operations increase the maximum access times to memory as it is unavailable during restore and refresh.

Dynamic memories in many cases have been implemented with internal refresh circuitry that attempts to hide the dynamic nature of the devices. The idea being that with the refresh and rewrite issues hidden by interface logic, the DRAM can appear to a circuit as if it is SRAM. These DRAM devices which appear substantially similar to SRAM devices are often referred to as 1T1C SRAM devices, which is a label indicative of their dynamic memory nature.

Using DRAM which operates similar to SRAM is attractive in that DRAM, even including the overhead of internal refresh logic can be fabricated in less die area than is required for SRAM. The 1T1C (1 Transistor 1 Capacitor) SRAM is a memory type which provides high memory density while incorporating SRAM similar interfacing. Yet, a number of compatibility issues remain with regard to using 1T1C SRAM in place of conventional SRAM.

(a) Invalid address issue.

Memory addresses for SRAM devices are always valid, unlike DRAM devices for which "invalid address" conditions can occur. Since SRAM chips have no need for the restore and refresh operations the requested output is always available. However, in DRAM, when the address is valid for an insufficient time to allow for the restore operation, the output cannot be generated and the cell information will be lost.

FIG. 1 depicts timing for different address periods. As shown in the figure, after chip select goes active (signal CSB going low), the duration of the memory address can vary. However, depending on the address duration period, several problems can occur in using 1T1C SRAM that result in an invalid address.

(i) Short address valid period: When the duration of the address is shorter than the minimum tRC, insufficient time is provided for the cell data to be restored (A). The minimum tRC is the minimum time needed required time to complete a DRAM operation read operation including a charge restoring operation.

(ii) Long address valid period: When the duration of the address is of sufficient length to complete any DRAM operation without causing any problems (B).

(iii) Excessively long address period: When the duration of the address is too long, typically longer than a few microseconds, the boosting level of a word line signal can be lowered and the cell restoring level can be degraded.

(b) Refresh hiding issue.

Since the 1T1C SRAM has the SRAM interface, control signals are not received for activating a refresh operation as in conventional DRAM even though the cell refresh operation is required since the DRAM leaky cell is used. The internal circuitry performs the refresh operations. However, the accesses to the cells for the purpose of refresh can be generated at any time, such as shown in FIG. 2.

(c) Page mode issue.

A fast access mode, referred to as a page cycle mode, can be utilized in which data is accessed in the same row without changing a row address thereby improving the performance of 1T1C SRAM. FIG. 3 depicts timing for a page mode 1T1C SRAM. The first data is fetched within the tRC time delay but the second data in the same row is fetched in the time period tPC which is typically much shorter than period tRC.

It will be appreciated, therefore, that many of the DRAM issues can pose a problem for the associated circuitry. These issues are typically handled by modifying the device specification sheet to guarantee 1T1C SRAM device operation, thus masking the invalid address and refresh hiding issues. That is, some restrictions are posed on 1T1C SRAM control timing which fall short of providing full compatibility with SRAM chips, and thereby limit the applicability of these memory devices. The following outlines typical restrictions which are posed on accessing 1T1C SRAM devices.

(a) Restrictions are specified to ensure sufficient address set-up and hold time for detecting the valid address. The restriction attempts to overcome the invalid address issue, however, it enforces unnecessarily extended timing margins for set-up and hold time which are not otherwise necessary for the vast majority of memory accesses.

(b) Restrictions are also specified to ensure that the address is available for a sufficient period of time to satisfy the underlying DRAM limitations. This approach, however, still does not provide full compatibility with true SRAM devices, and burdens the circuit with additional memory access limitations.

(c) Restrictions are imposed on address skew which are often quite strict.

(d) Restrictions are imposed on timing instances to be avoided so as to prevent erroneous memory operation.

FIG. 4 depicts a conventional pulsed word line scheme within a 1T1C SRAM memory device. Access commands (i.e. read or write) and/or address are being received by the Address Buffer and Command Buffer. The ATD Generator detects address transitions while the CMD Generator generates commands. In response to the ATD Generator and CMD Generator an Addi block generates a valid address internally. A Decoder decodes the valid internal address and a Block coding block selects valid memory array blocks. A Sensing control block generates BLSA (Bit Line Sense Amplifier) control signals and other related signals.

A WL Generator (word line generator) operates to enable the word line of the DRAM cell array. An S/A enable block generates a BLSA enable signal.

During read or write operations a Delay Circuit block creates guaranteed delay times for cell restore, while an End of restore block creates an (EOR) end of restore signal. The EOR signal disables the word line and the Sensing control block signals when the read or write access operation is finished. The chip then enters a stand-by mode.

FIG. 5 is a block diagram of a conventional refresh scheme. Accesses are being performed (read or write) and the Address Buffer, Command Buffer, ATD Generator, CMD Generator and Addi are operating as described for FIG. 4. An Active & refresh Arbitrator block determines whether to perform a read or write operation or a refresh operation. The following cases can arise when a Refresh control block request refresh operation.

Case 1—In this case the chip is in a stand-by mode and refresh is performed.

Case 2—In this case the chip is performing a read or write operation, wherein the refresh operation is delayed until the read or write operation is completed.

Case 3—In this case the read or write command conflicts with the refresh request, wherein Arbitrator decides order.

The Decoder block decodes valid internal addresses and the Block coding block selects valid memory array blocks.

FIG. 6 is a block diagram of a conventional late write scheme. Accesses are being performed (read or write) and the Address Buffer, Command Buffer, ATD Generator, CMD Generator and Addi are operating as described for FIG. 4 and FIG. 5. In response to a write command the present address is latched in the Add. Latch block and the present data is latched in the Data in Latch block. If the chip was previously performing a write command, the Addi block generates a valid address internally (i.e. it is N−1 write addresses from the latch). If the chip did not perform a prior write command, then no more operation will be performed. If the chip was previously performing a write command, then the Write Driver block drives write (data in) data (i.e. it is N−1 data in from latch).

The Row Decoder block decodes valid internal addresses for Row(WL) selection by WL Generator block. The Column Decoder block decodes valid internal addresses for Column(CSL) selection by CSL Generator. The WL Generator block enables the word line. The End of Restore (EOR) block (not shown) disables WL and the Sensing control signals when write operation is finished. The chip then enters a stand-by status.

Accordingly, the present DRAM devices (1T1C SRAM) which attempt to simulate conventional SRAM devices have a number of drawbacks which limit access speed and applicability and which are not fully compatible with conventional SRAM devices, thus complicating memory interfacing and use. The present invention overcomes these deficiencies, as well as others, of previously developed 1T1C SRAM interfacing solutions and provides a number of benefits.

BRIEF SUMMARY OF THE INVENTION

The present invention provides circuits and methods for interfacing dynamic memory (DRAM), making it fully compatible with static memory (SRAM) operation. The invention is particularly well-suited for use with 1T1C (1 transistor and 1 capacitor) memory cells, which can provide higher memory densities than available with conventional SRAM memory cells that typically comprise six or more transistors (i.e. 6T SRAM). The obstacles to utilizing the DRAM as a core of an SRAM compatible device are overcome within the invention to optimize speed while reducing the burden on other circuits.

The inventive method utilizes pulsing the word line for accessing memory, which makes other word lines available for performing refresh operations. The method also provides for comparing the duration of external address signals, and detecting valid addresses which are accessed in response to the availability of the address beyond a given duration, such as being equal to or exceeding the minimum tRC cycle time. In addition late writing is enforced in which the write operation begins after the write control signal is disabled.

An embodiment of the present invention can be generally described as a memory circuit having dynamic memory cells configured to simulate static memory, comprising: (a) an array of dynamic memory cells, preferably comprising a single transistor and capacitor (1T1C) for each memory bit; (b) an internal address generating circuit configured for receiving address and command information and generating internal addresses; (c) a decoder circuit for receiving the internal addresses and controlling access to the dynamic memory cells; and (d) means for generating a word line output to the dynamic memory when triggered by the decoder circuit and which is terminated in response to maximum cycle time (tRC) when in non-paged mode, or maximum page mode cycle time (tPMRC) when in page mode.

The memory circuit may further comprise means for comparing external address durations against an internal duration to detect invalid address durations and ignoring the associated operation. The memory circuit may further comprise means for commencing the write operation following disabling of a write control signal.

Another embodiment of the present invention can be described as a memory device, comprising: (a) a plurality of dynamic random access memory (DRAM) cells; and (b) an interface circuit coupled to said DRAM cells and having circuitry for performing read, write and refresh operations incorporating circuits configured for performing one or more of the following, (i) pulsed operation of the word lines in response to page and non-paged modes to provide refresh hiding, (ii) address duration comparison for ignoring operations associated with address of an invalid length, (iii) performing a write operation following disabling of a write control signal.

These beneficial aspects can be practiced separately to increase compatibility of the dynamic RAM devices with static RAM interfacing, or in combination to provide a fully compatible SRAM interface.

Another embodiment of the present invention can be described as a memory device, comprising (a) a plurality of dynamic random access memory (DRAM) cells; (b) an interface circuit coupled to said DRAM cells and having circuitry for performing read, write and refresh operations; and (c) address duration comparison circuitry configured for ignoring operations associated with addresses which are received of an invalid length.

Another embodiment of the present invention can be described as a memory device, comprising (a) a plurality of dynamic random access memory (DRAM) cells; (b) an interface circuit coupled to said DRAM cells and having circuitry for performing read, write and refresh operations; and (c) a late write circuit configured for performing a write operation following disabling of a write control signal.

Another embodiment of the present invention can be described as a memory circuit having dynamic memory cells configured to simulate static memory, comprising: (a) an array of dynamic memory cells, such as 1T1C SRAM; (b) an internal address generating circuit configured for receiving address and command information and generating internal addresses; (c) a decoder circuit for receiving the internal addresses and controlling access to the dynamic memory cells; (d) a word line control circuit configured to output a word line to said dynamic memory when triggered by said decoder circuit and which is terminated in response to maximum cycle time (tRC) when in non-paged mode, or maximum page mode cycle time (tPMRC) when in page mode; (e) an address comparison circuit configured for comparing external address durations against an internal duration to detect invalid address durations and ignoring the associated memory operation; and (f) a late writing circuit configured for commencing the write operation following disabling of a write control signal to the array of dynamic memory cells.

An embodiment of the invention may also be described as a method of interfacing a plurality of dynamic random access memory cells to external address, data and control signals, comprising: (a) pulsing the word line for accessing memory wherein other word lines are available for refresh operations; (b) enabling a word line for a given access in response to detecting that the duration of an external address signal is equal to or exceeds the minimum tRC cycle time; and (c) commencing a write operation after the write control signals have been disabled.

It should be appreciated that a number of aspects of the present invention are described herein, including but not limited to the following. It should also be noted that the following aspects of the invention can be implemented separately or in combination without departing from the teachings of the present invention.

An aspect of the invention is to provide enhanced compatibility of 1T1C SRAM devices and similar devices based on dynamic memory cores, with conventional SRAM devices.

Another aspect of the invention is to provide refresh hiding, page mode cycle support, and eliminate current restrictions on access timing.

Another aspect of the invention is to provide a refresh hiding method which utilizes pulsed word lines, wherein the word lines for other cells are available for supporting refresh operations.

Another aspect of the invention is to provide address duration comparisons in which the validity of the address is checked in the first part and the access commences in the second part of the address which exceeds a given duration, such as equal to or exceeding minimum tRC cycle time.

Another aspect of the invention is to provide address buffering to guarantee a timing margin, insofar as the address is available for a desired duration, such as tRC.

Another aspect of the invention is that of providing a late writing mechanism in which the write operation is started in response to disablement of the write control signal.

A still further aspect of the invention is to provide an interface mechanism which allows for incorporating dynamic memory cells within a fully SRAM compatible memory device.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 9 is a timing diagram of late write timing according to an aspect of the present invention.

FIG. 10 is a timing diagram of page cycle timing according to an aspect of the present invention.

DETAILED DESCRIPTION OF THE INVENTION

Referring more specifically to the drawings, for illustrative purposes the present invention is embodied in the apparatus generally shown in FIG. 7 through FIG. 14. It will be appreciated that the apparatus may vary as to configuration and as to details of the parts, and that the method may vary as to the specific steps and sequence, without departing from the basic concepts as disclosed herein.

1. Introduction.

To solve the dynamic memory problems associated with the use of 1T1C SRAM memories, or similar SRAM memories utilizing a dynamic memory (DRAM) core, new concepts are embodied which are described herein. These new design concepts overcome the timing restrictions and problems which arise as a consequence of utilizing the DRAM core, such as 1T1C cell structures, to create SRAM compatible memories. In addition, the new concept can be implemented without the need for complicated logic and implementing the concept does not significantly increase die size. Consequently, the new designs are readily implemented while they can provide full compatibility between 1T1C SRAM devices (or similar) and conventional SRAM devices.

The new design concept includes a number of beneficial aspects, such as the following. A pulsed word line structure is provided which is limited by the maximum page mode cycle time. An address duration compare function with optional buffering is provided. A late write function is also supported. These are described in more detail in the following.

2. Pulsed Word Line Structure.

A pulsed word line structure is provided which is limited by the maximum page mode cycle time. To implement a refresh hiding scheme, the word line is used in a pulsed mode (pulsed or automatically shut down after some short period of time) during any operation, read and write. It will be appreciated that keeping a word line open for the entire active operation (level sensitive word line), prevents cells from being refreshed at a different word line.

Therefore, the use of a pulsed word line can aid in providing refresh hiding, since the word line to other cells can be active making hidden refresh operations possible. However, in order to implement a page mode cycle time, the word line should not be opened at a new address since tPC is much shorter than tRC and thus, the cell storing time is not sufficient. Instead, an internal pulse is generated which is shut down after the maximum page mode cycle time. In this way the requirement to guarantee the minimum tRC can be readily eliminated. By way of example an internal counter can be utilized to implement this aspect.

Figure 7:
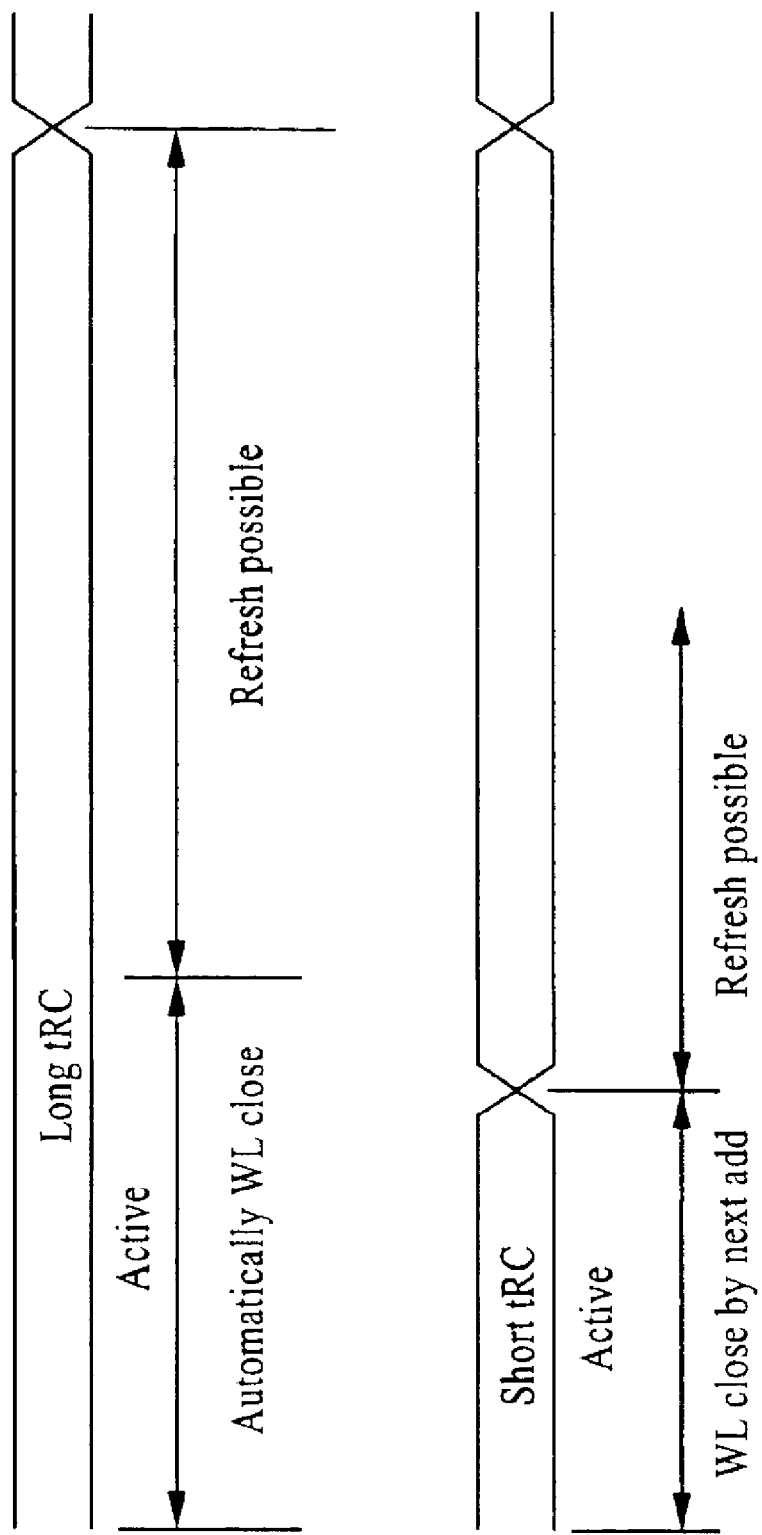
FIG. 7 is a timing diagram of address detection and cell data refreshing according to an aspect of the present invention.

FIG. 7 illustrates waveforms associated with shutting off the word line by command or in response to the subsequent address. When an address has a long duration time, the word line can be shut off after tPMRC (page mode RAS cycle time). It should be noted that refresh periods are alternated with periods in which the data can be accessed in a cycle called the RAS Cycle (tRC), which has two periods. When an address duration is shorter than tPMRC, the word line can be shut off at the next address.

By following this design concept, refresh hiding and page mode cycle timing can be supported while the necessity of timing restrictions for controlling 1T1C SRAM are eliminated. The inventive mechanisms can support sequential page cycle path, wherein the use of extra logic, data lines and internal latches are not necessary for supporting page mode cycle times.

3. Address Duration Compare Function.

An embodiment can be implemented utilizing internal tRC timing, having a minimum time to facilitate DRAM operation, which is shorter than external tRC on the specification sheet since the address duration period specified on the specification sheet includes all other time-consuming operations such as external address buffering time. So, a portion of address duration can be compared for controlling internal memory operations.

Figure 8:
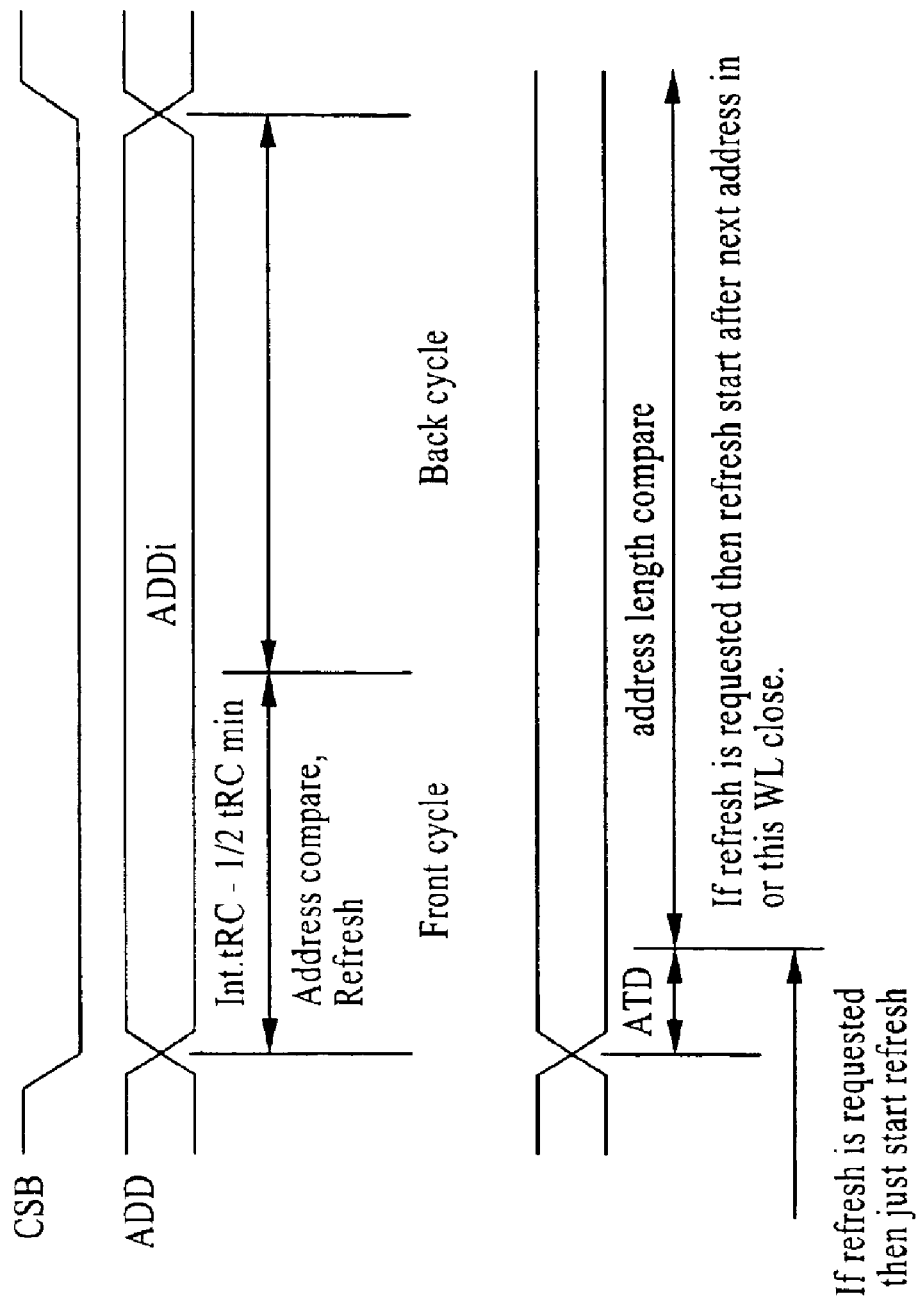
FIG. 8 is a timing diagram of word line shut off timing according to an aspect of the present invention.

FIG. 8 illustrates an example waveform in which part of the address duration is utilized for controlling the memory operation. The address duration period of external addresses is preferably divided into two parts, with the front portion being utilized for valid address detection.

Consider a scenario in which the duration of the external address is 70 ns and the internal tRC is 35 ns. After the external address changes (e.g. using an address transition detection (ATD) scheme), the duration measure commences. When the duration is equal to or exceeds internal minimum tRC cycle time, a word line is enabled and starts the DRAM core operation. But when the duration is shorter than the internal minimum tRC cycle time, a word line is not enabled and no operation is performed. That is, enabling a word line and starting a DRAM operation according to the address duration time can be performed. Several cases should be considered based on the following address transitions.

(1) The measured address duration time is longer than internal minimum tRC and the subsequent address is changed after the internal minimum tRC cycle time. In this case sufficient time for DRAM operation is provided and the DRAM operation related with the address can be performed without any problems.

(2) The measured address duration time is longer than internal minimum tRC but the new address changes after the word line is enabled.

(a) When the duration of the new address is longer than internal minimum tRC, a new word line by the new address will be enabled after the internal minimum tRC. Consequently, the DRAM operation related with the address can be completed without any problems.

(b) When the duration of the new address is shorter than the internal minimum tRC and a new word line is not enabled, the DRAM operation associated with the first address can continue.

(i) When the next address (3rd address) is longer than the internal minimum tRC and the new word line is enabled after the internal minimum tRC, there is sufficient time to complete the DRAM operation associated with the first address.

(ii) When the next address (3rd address) is shorter than the internal minimum tRC and no new word line is enabled, the DRAM operation associated with the first address can continue.

(3) When the measured address duration time is shorter than the internal minimum tRC, then no new word line is enabled and no operation is performed.

According to the invention the need to restrict timing for controlling 1T1C SRAM accesses can be eliminated. In one embodiment, this aspect of the invention can be realized by incorporating a buffer between the first part and the second part of the external address to guarantee a timing margin. In addition, the external address can be divided into three parts instead of two parts, such as utilizing (1) address duration compare, (2) active (refresh) and (3) active (refresh).

4. Late Writing Mechanism.

To use the pulsed word line scheme to perform a write operation, the word line should be open at the proper time, and valid data can be written during word line open.

FIG. 9 illustrates a timing diagram associated with an embodiment of the invention for controlling DRAM write operations. It should be noted that in conventional designs, the data write starts in the following cycle. So, if the write cycle is followed by the read cycle, two addresses should be kept and two operations should be performed in the following cycle. The two addresses kept comprise one old address to write data into the cell, and the new address to read out the data. These operations complicate chip operation and constitute a bottleneck which thwarts efforts to reduce cycle time.

To overcome these problems the present invention commences the write operation following the write control signal (e.g. WEB in FIG. 9) being disabled, wherein the complicated situation outlined above can be eliminated.

FIG. 10 shows a possible page mode cycle time with possible refresh periods based on this new design concept to eliminate the need for complicated memory control timing and circuits.

5. Circuit Embodiment of SRAM compatible 1T1C SRAM.

Figure 11:
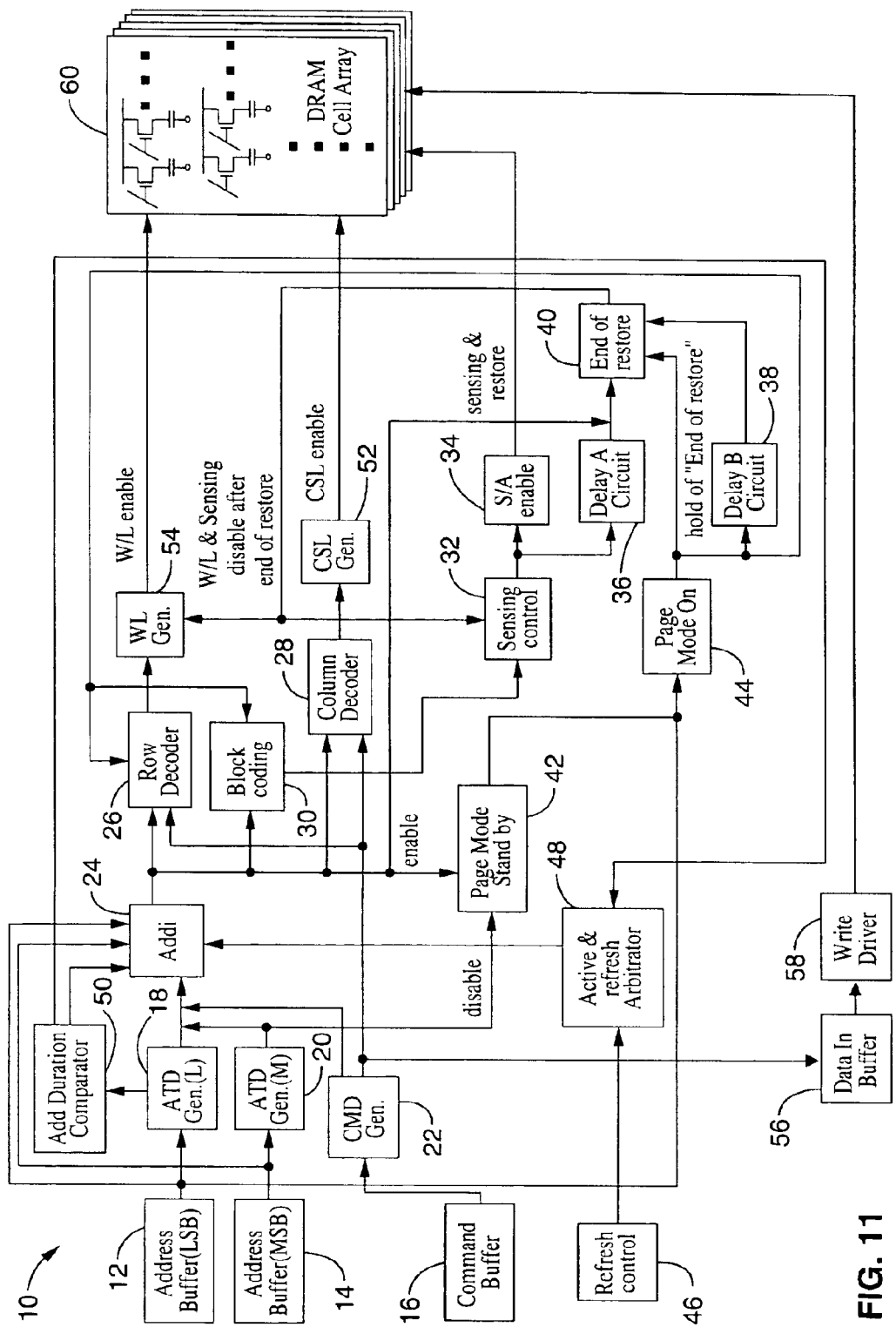
FIG. 11 is a block diagram of a dynamic RAM configured for static RAM interfacing according to an embodiment of the present invention.

FIG. 11 illustrates by way of example embodiment an SRAM compatible dynamic RAM 10, in particular a 1T1C dynamic RAM configured for compatibility with SRAM interfacing. The new 1T1C SRAM comprises the following blocks. An Address Buffer (LSB) 12 and Address Buffer (MSB) 14 receive address information while data and commands are received in Command Buffer 16. ATD Generator blocks (M and L) 18, 20 are configured for generating address transition detections. A CMD Generator block 22 is configured for generating commands. An Addi block 24 provides an internal address generator block. A decoder section determines the internal addresses which in this embodiment comprises a Row Decoder block 26 for decoding internal row addresses, and a Column Decoder block 28 for decoding internal column addresses.

A Block coding block 30 provides memory block selection coding. A Sensing control block 32 is configured for controlling the bit line sense amplification and delay circuit. An S/A enable block 34 provides a bit line sense amplifier enable. A Delay A Circuit block 36 is configured to provide sufficient delay to guarantee memory cell restoration. A Delay B circuit block 38 is configured for providing sufficient delay to guarantee maximum page mode cycle time. An End of restore block 40 establishing the timing for terminating cell restore.

A Page Mode Stand-by block 42 is configured to operate in response to receipt of read or write commands. A Page Mode On block 44 is configured to enable page mode. A Refresh control block 46 is configured for controlling DRAM cell refreshing. An Active and Refresh Arbitrator block 48 is configured for arbitrating between reads and writes and refreshes. An Address Duration Comparator block 50 is configured for comparing external address durations with internal read cycle time (tRC) or internal write cycle time (tWC). A CSL Generator (Column Select Line) block 52 is configured for generating column select lines signals, while the WL Generator (Word Line) block 54 is configured for generating the word line, which controls the memory cell transistor gate. A Data In Buffer block 56 is configured to internally latch the data. A Write Driver block 58 is configured for driving the data for write operations. Finally a DRAM Cell Array 60 is the core of the memory configured with an array of DRAM (Dynamic Random Access Memory) cells, such as a (1T1C) cell array.

5.1. Read Command.

During execution of a read command, the read command and/or addresses are being received with the address portions preferably processed in separate portions, such as a most significant byte (MSB) and least significant byte (LSB), or other division. It will be appreciated that only the LSB will change when Page Mode is being performed after a read command. Active and refresh Arbitrator block 48 decides whether to perform a read operation or a refresh operation. In response to Refresh control block 46 requesting a refresh operation:

Case 1—When chip is in stand-by mode, refresh operations are performed.

Case 2—During a read operation the refresh operation waits until the read operation is finished.

Case 3—If both read and refresh request are in conflict, the refresh is performed for the address duration comparing time.

The ATD Generator blocks 18, 20 detect address transitions, while the CMD Generator block 22 generates commands. The Add. Duration Comparator block 50 measures address duration:

Case 1—if the address is a valid duration: then processing continues.

Case 2—if the address is an Invalid length then the external address is ignored (no operation is performed).

The Addi block 24 generates a valid address internally. Page Mode Stand-by block 42 is enabled after a valid internal address has been set. If the address MSB changes (non-page mode) in the next cycle (Normal Mode Cycle), then Page Mode Stand-by block 42 will be disabled. If only the LSB changes in the next cycle (Page Mode Cycle), then Page Mode On block 44 is enabled. The Row Decoder block 26 decodes valid internal addresses for Row(WL) selection. The Column Decoder block 28 decodes valid internal addresses for Column(CSL) selection. The Block coding block 30 selects a valid memory array block. The Sensing control block 32 generates BLSA (Bit Line Sense Amplifier) control signals and other related signals. The WL Generator block 54 enables the word line at the appropriate timing.

The S/A enable block 34 generates the BLSA enable signal, after which a read operation is performed. The Delay A Circuit block 36 generates a delay time to provide a guaranteed cell restore. The End of restore (EOR) block 40 generates the restore end signal which disables the word line generated by the WL Generator block 54 and signals from Sensing control block 32 when the read operation is finished. After this the chip enters a stand-by mode.

If the address MSB changes in the next cycle, therefore a Normal Mode Cycle, then the Page Mode Stand-by block 42 is disabled. In the case of a valid command the chip operation returns to processing of the read command, if the command is invalid the chip remains in stand-by mode.

If only the LSB changes in the next cycle (Page Mode Cycle), then the Page Mode On block 44 is enabled. If the Page Mode On block 44 is controlling Decoder and Block coding then the steps in the paragraph above describing "Row Decoder block 26 decodes valid internal addresses for Row(WL) selection and Column Decoder block 28 decodes valid internal addresses for Column(CSL) selection" are repeated. Delay B Circuit block 38 generates guaranteed delay timing for maximum tPMRC (Page Mode Cycle Time). If address MSB changes prior to maximum tPMRC, then Page Mode Stand-by block 42 and Page Mode on 44 block will be disabled and the read operation will be performed with external address (MSB) changed information. If the address MSB does not change until tPMRC, then Delay B Circuit block 38 controls the End of restore block 40 and the read operation will be performed with Delay B circuit block 38.

5.2. Write Command.

During a write command the write command and/or addresses are being received, with the address portions preferably processed in separate portions, such as a most significant byte (MSB) and least significant byte (LSB), or other division. It will be appreciated that only the LSB will change when Page Mode is being performed after a read command. Active and refresh Arbitrator block 48 decides whether to perform a write operation or a refresh operation. A number of cases can arise in response to Refresh control block 46 requesting a refresh operation:

Case 1—When chip is in stand-by mode, refresh operations are performed.

Case 2—During a write operation the refresh operation waits until the write operation is finished.

Case 3—If both write and refresh request are in conflict refresh is performed for the address duration comparing time.

The ATD Generator blocks 18, 20 detect address transitions, while the CMD Generator block 22 generates commands. The Add Duration Comparator block measures address duration:

Case 1—if the address is a valid duration: then processing continues.

Case 2—if the address is an invalid length then the external address is ignored (no operation is performed).

When the write command is completed Addi block 24 generates a valid address internally and Write Driver block 58 drives the write (data in) data. Page Mode Stand-by block 42 is enabled after a valid internal address has been set. If the address MSB changes in the next cycle (Normal Mode Cycle), then Page Mode Stand-by block 42 will be disabled. If only the LSB changes in the next cycle (Page Mode Cycle), then Page Mode On block 44 is enabled. The Row Decoder block 26 decodes valid internal addresses for Row(WL) selection, and the Column Decoder block 28 decodes valid internal addresses for Column(CSL) selection. The Block coding block 30 selects a valid memory array block. The Sensing control block 32 generates BLSA (Bit Line Sense Amplifier) control signals and other related signals. The WL Generator block 54 enables the word line at the appropriate timing.

The S/A enable block 34 generates the BLSA enable signal. A write operation is then performed. The Delay A Circuit block 36 generates a delay time to provide a guaranteed cell restore. The End of Restore (EOR) block 40 generates the restore end signal which disables the word line generated by the WL Generator block 54 and signals from Sensing control block 32 when the write operation is finished. Afterward the chip enters a stand-by mode.

If the address MSB changes in the next cycle, representing a Normal Mode Cycle, then the Page Mode Stand-by block 42 is disabled. In the case of a valid command the chip operation returns to the start of processing of the write command. If the command is invalid the chip remains in stand-by mode.

If only the LSB changes in the next cycle (Page Mode Cycle), then the Page Mode On block 44 is enabled. If Page Mode On block 44 is controlling Decoder and Block coding then the steps in the paragraph above describing "When the write command is completed the Row Decoder block 26 decodes valid internal addresses for Row(WL) selection and Column Decoder block 28 decodes valid internal addresses for Column(CSL) selection" are repeated. Delay B Circuit block 38 generates guaranteed delay timing for maximum tPMRC (Page Mode Cycle Time). If address MSB changes prior to maximum tPMRC, then Page Mode Stand-by block 42 and Page Mode on 44 block will be disabled and the write operation will be performed with external address (MSB) changed information. If the address MSB does not change until tPMRC, then Delay B Circuit block 38 controls the End of restore block 40 and the write operation will be performed with Delay B circuit block 38.

5.3. Pulsed Word Line Operation.

Figure 12:
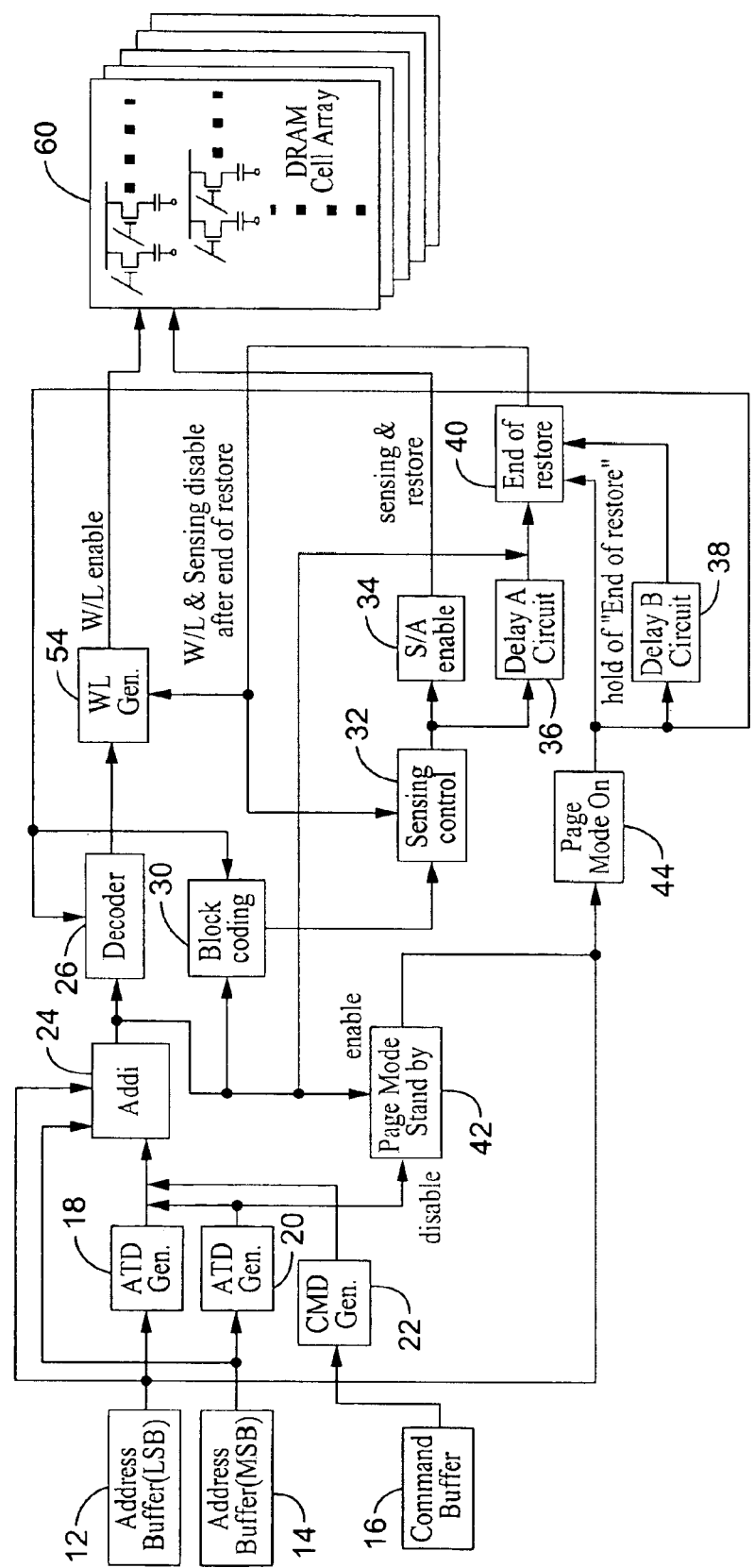
FIG. 12 is a block diagram of a pulsed word line method according to an embodiment of the present invention.

FIG. 12 depicts blocks relating to the pulsed word line operation of the present invention. New function blocks according to the invention are shown highlighted, including Page Mode Stand-by block 42, Page Mode On block 44, and Delay B Circuit block 38. It should be noted that unlike FIG. 11, this embodiment has a single Decoder block 26 instead of Row Decoder block 26 and Column Decoder block 28. It should be noted that unlike the prior art circuit of FIG. 6, this embodiment does not require the Data In Latch block or the Add. Latch block.

According to the pulsed word line method addresses for read or write commands are being received, with the address portions preferably processed in separate portions, such as a most significant byte (MSB) and least significant byte (LSB), or other division. It will be appreciated that only the LSB will change when Page Mode is being performed after a read or write command.

The Addi block 24 generates a valid address internally. Page Mode Stand-by block 42 is enabled after a valid internal address has been set. If the address MSB changes in the next cycle (Normal Mode Cycle), then Page Mode Stand-by block 42 will be disabled. If only the LSB changes in the next cycle (Page Mode Cycle), then Page Mode On block 44 is enabled.

The Decoder block 26 decodes valid internal addresses. The Block coding block 30 selects a valid memory array block. The Sensing control block 32 generates BLSA (Bit Line Sense Amplifier) control signals and other related signals. The WL Generator block 54 enables the word line at the appropriate timing.

The S/A enable block 34 generates the BLSA enable signal. A read or write operation is then performed. The Delay A Circuit block 36 generates a delay time to provide a guaranteed cell restore. The End of restore (EOR) block 40 generates the restore end signal which disables the word line generated by the WL Generator block 54 and signals from Sensing control block 32 when the read or write operation is finished. After this the chip enters a stand-by mode.

If the address MSB changes in the next cycle, therefore a Normal Mode Cycle, then the Page Mode Stand-by block 42 is disabled. In the case of a valid command the chip operation returns to the start of processing of the read or write command. If the command is invalid the chip remains in stand-by mode.

If only the LSB changes in the next cycle (Page Mode Cycle), then the Page Mode On block 44 is enabled. Page Mode On block 44 is coupled for controlling Decoder block 26 and Block coding block 30. In response to a page mode on signal the decodes this new in page address as described by the preceding paragraph describing "Decoder block 26 decodes valid internal addresses". Delay B Circuit block 38 generates guaranteed delay timing for maximum tPMRC (Page Mode Cycle Time). If address MSB changes prior to maximum tPMRC, then Page Mode Stand-by block 42 and Page Mode on 44 block will be disabled and the read or write operation will be performed with external address (MSB) changed information. If the address MSB does not change until tPMRC, then Delay B Circuit block 38 controls the End of restore block 40 and the read or write operation will be performed with Delay A circuit block 36 providing sufficient delay time for a guaranteed cell restore.

5.4. Address Duration Compare Operation.

Figure 13:
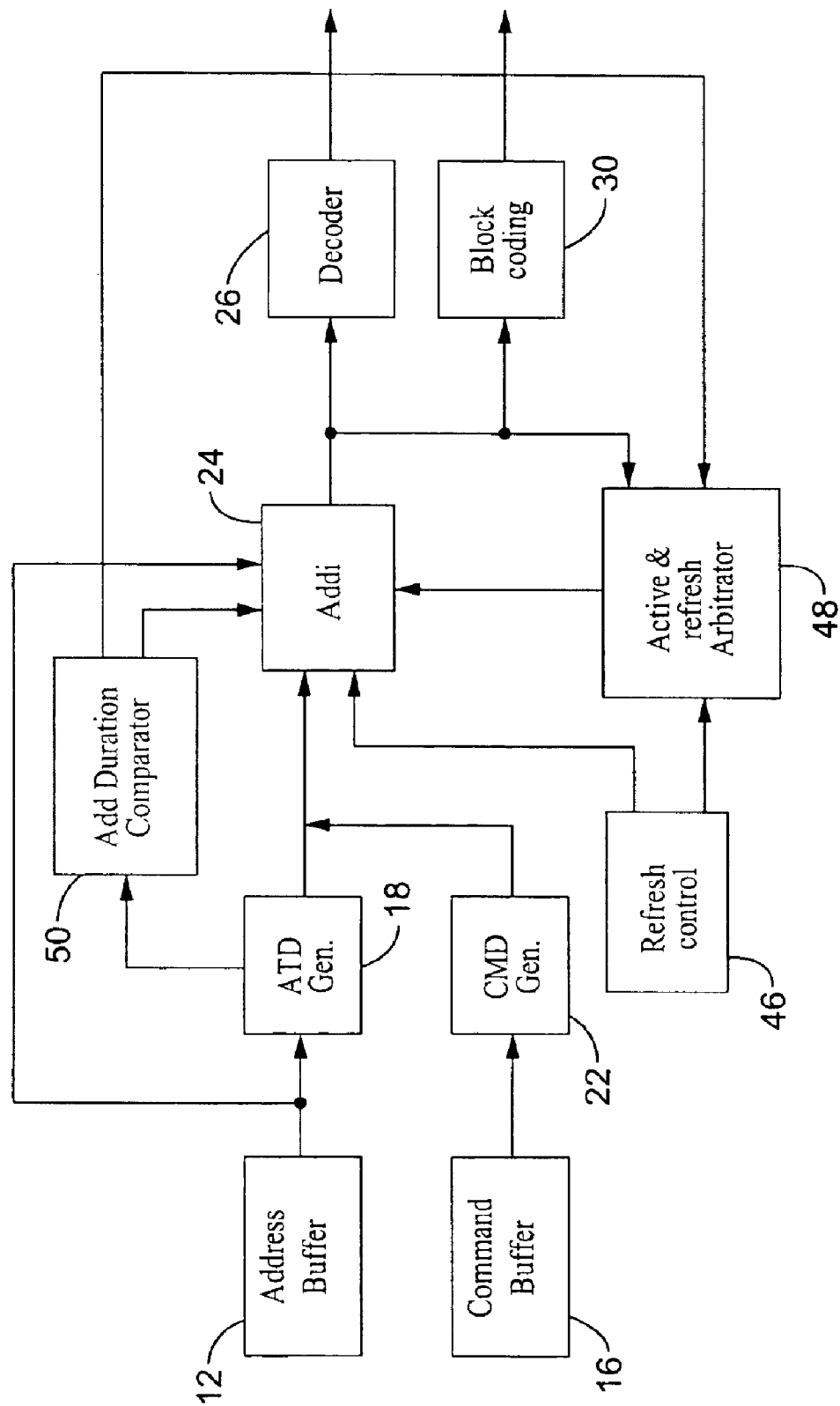
FIG. 13 is a block diagram of a refresh method according to an embodiment of the present invention.

FIG. 13 depicts blocks relating to refresh operation of the present invention. An address duration comparator block 50 is shown which was added in the present invention. It should be noted that this embodiment has a single Address Buffer block 12 instead of the split MSB, LSB Address Buffers 12, 14 of FIG. 11. Similarly, this embodiment utilizes a single ATD Generator 18 instead of the MSB and LSB ATD Generators 18, 20 of FIG. 11. In addition this embodiment has a single Decoder block 26 instead of Row Decoder block 26 and Column Decoder block 28 as exemplified in FIG. 11. For the sake of clarity a number of other blocks are left off of this embodiment.

During a read or write command the addresses for read or write commands are being received. Active and refresh Arbitrator block 48 decides whether to perform an access (read or write) operation or a refresh operation, in response to Refresh control block 46 requesting a refresh operation. The following cases should be considered.

Case 1—When chip is in stand-by mode, refresh operations are performed.

Case 2—During a write operation the refresh operation waits until the read or write operation is finished.

Case 3—If both read or write and request are in conflict, a refresh is performed for the address duration comparing time.

The ATD Generator blocks 18 detect address transitions, while the CMD Generator block 22 generates commands. The Add. Duration Comparator block 50 measures address duration. The following cases based on address duration should be considered.

Case 1—if the address is a valid duration: then processing continues.

Case 2—if the address is an invalid length then the external address is ignored (no operation is performed).

When the read or write command is completed the Addi block 24 generates a valid address internally. The decoder (Row Decoder block 26 and Column Decoder block 28) decodes valid internal addresses. The Block coding block 30 selects a valid memory array block.

5.5. Late Write Operation.

Figure 1:
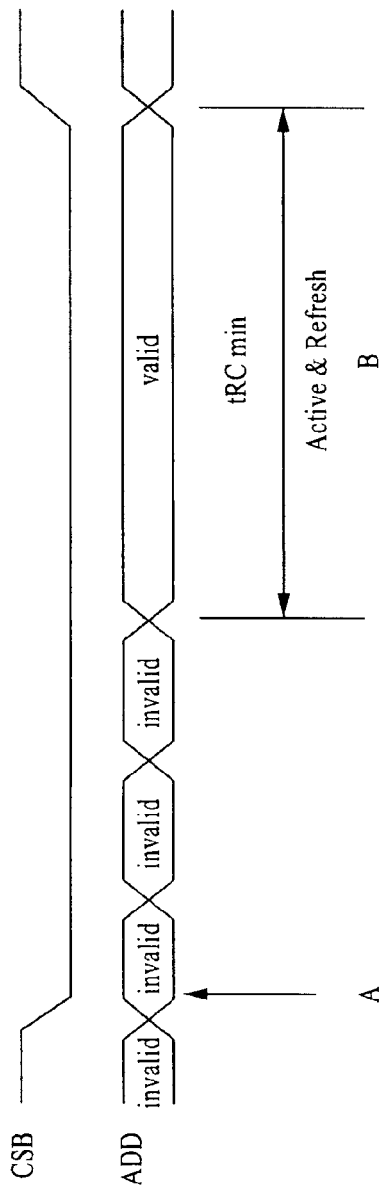
FIG. 1 is a timing diagram of different addressing periods during a conventional dynamic random access memory operation.
Figure 2:
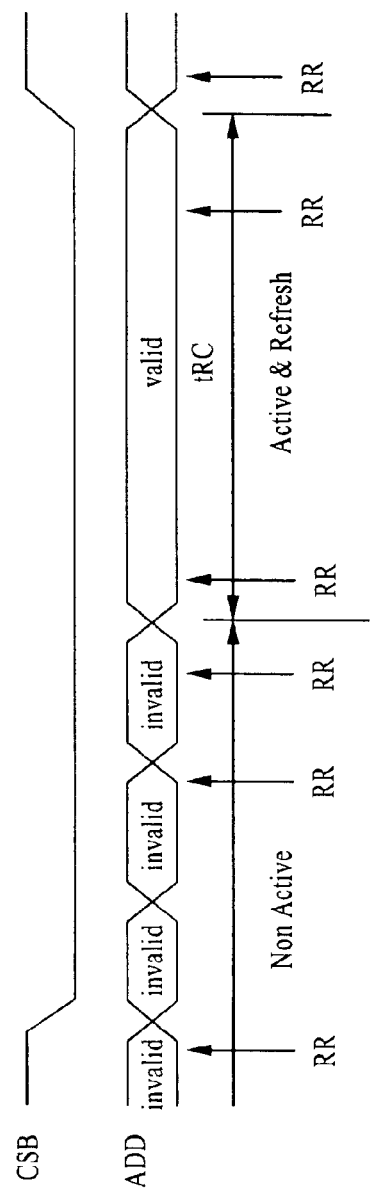
FIG. 2 is a timing diagram of refresh activity that can occur at any time within a conventional dynamic random access memory operation.
Figure 3:
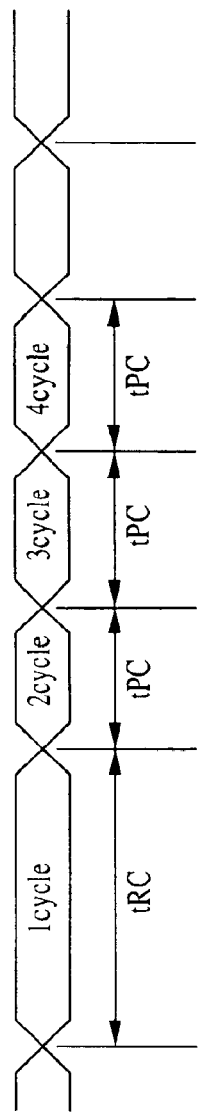
FIG. 3 is a timing diagram of page mode cycle timing within a conventional dynamic random access memory.
Figure 4:
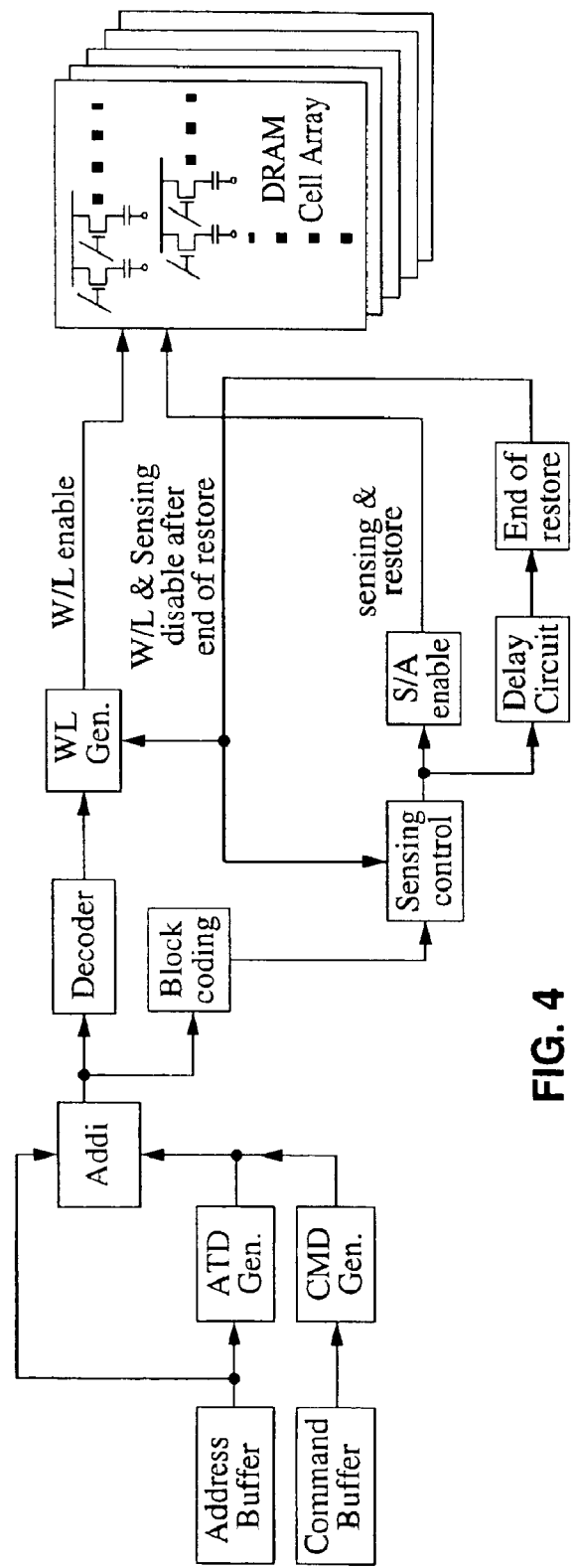
FIG. 4 is a block diagram of a conventional pulsed word line scheme.
Figure 5:
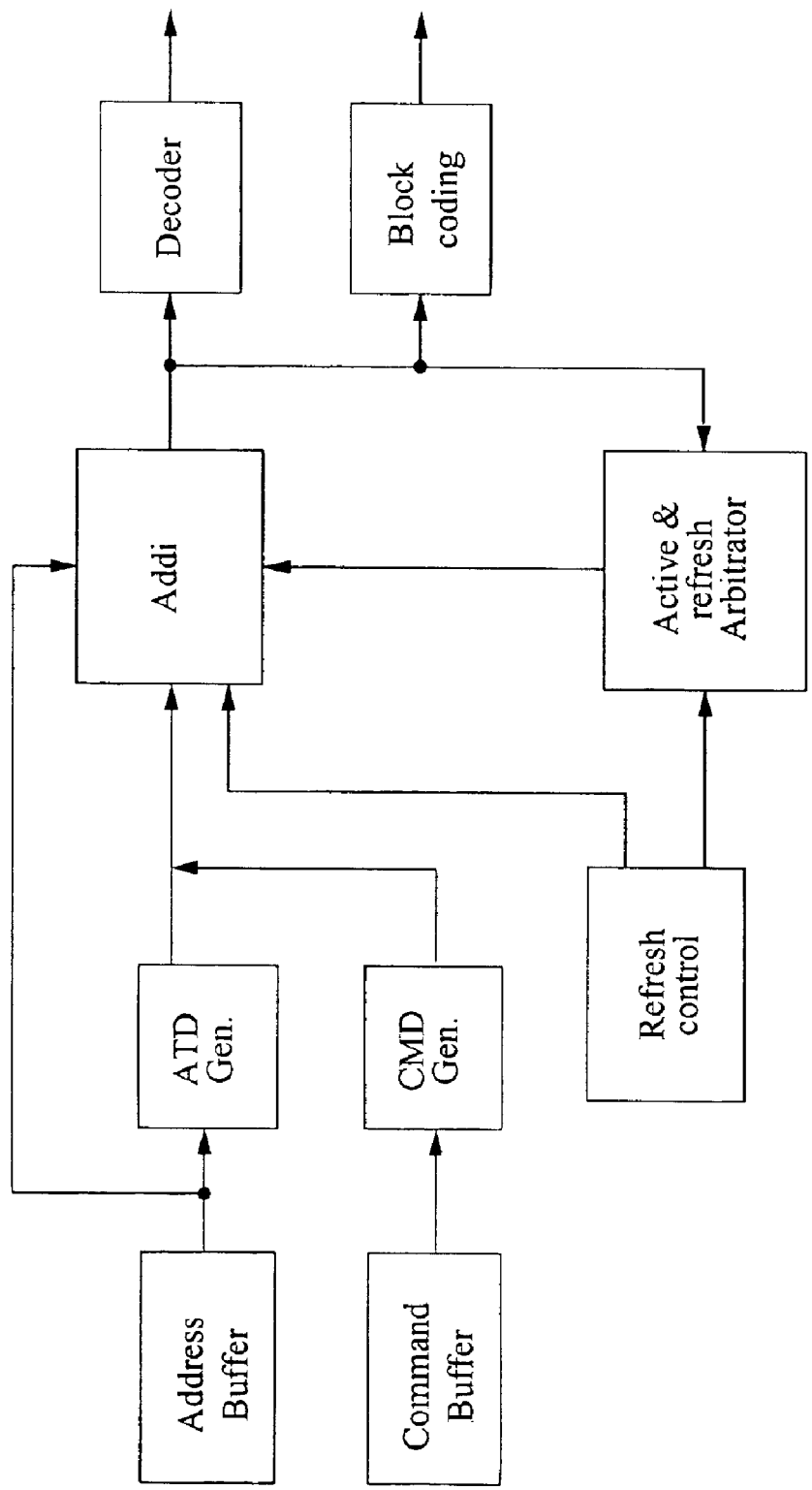
FIG. 5 is a block diagram of a conventional refresh scheme.
Figure 6:
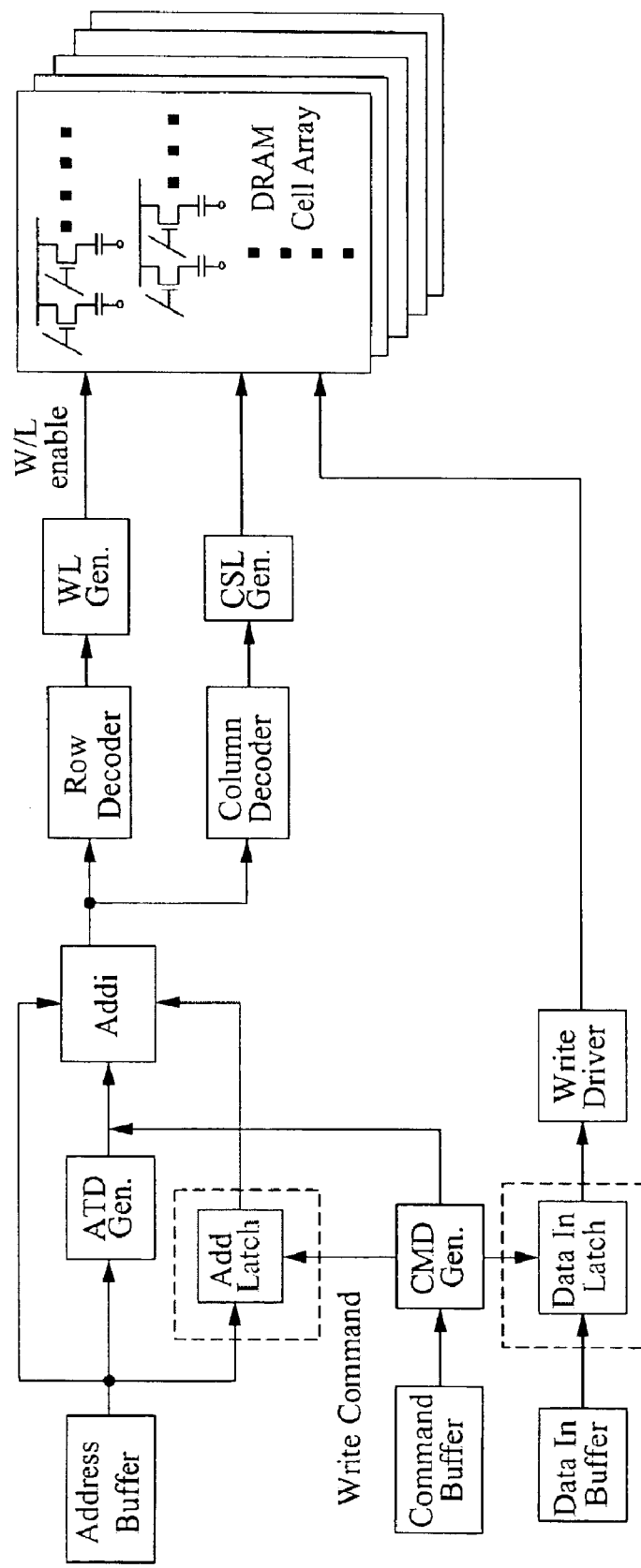
FIG. 6 is a block diagram of a conventional late write scheme.
Figure 14:
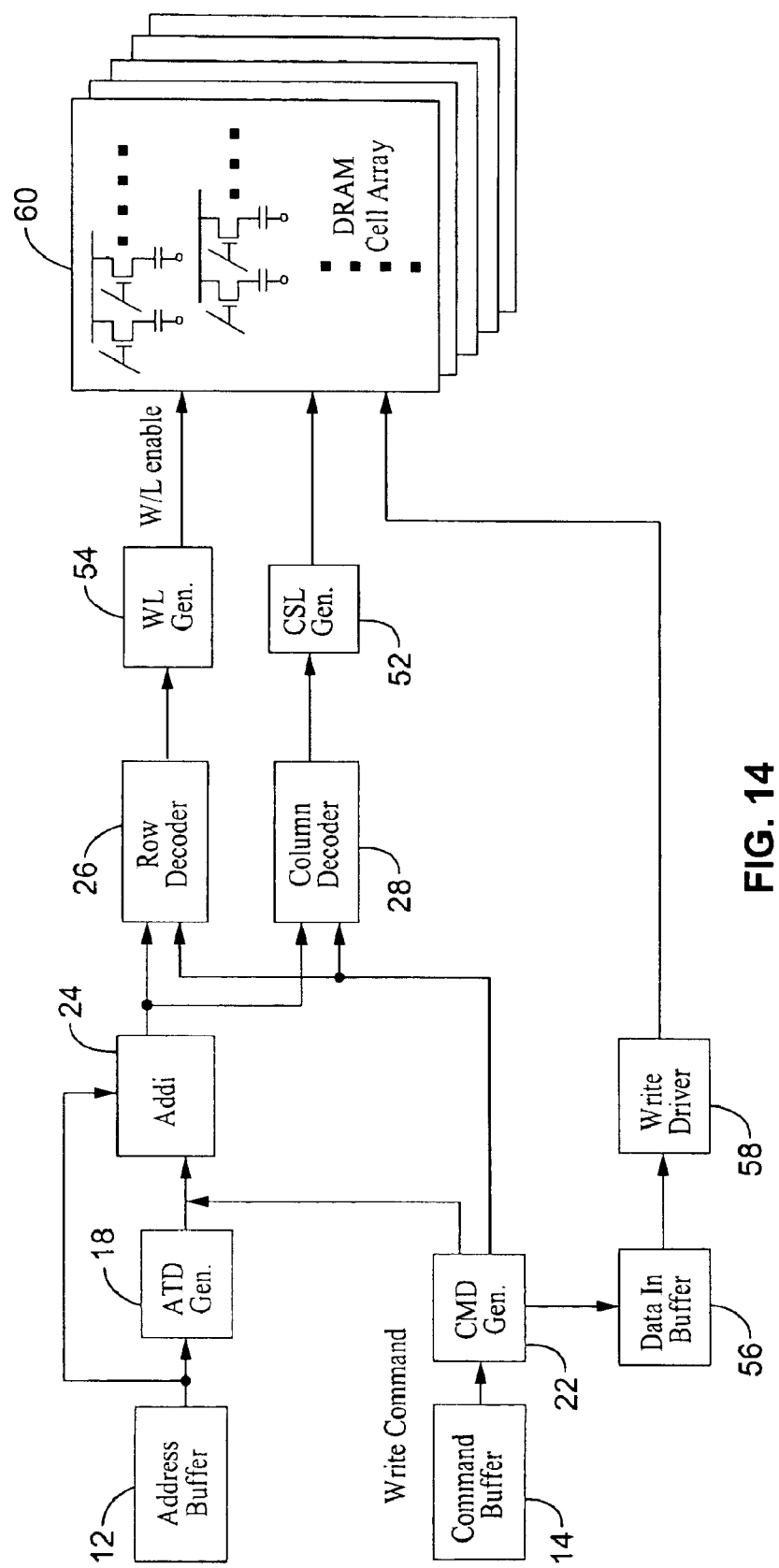
FIG. 14 is a block diagram of a late write method according to an embodiment of the present invention.

FIG. 14 depicts a block diagram for describing the late write operation of the present invention. It should be noted that the Address Latch block and Data In Latch block depicted in the conventional memory of FIG. 6 are not included in the late write scheme of the present invention. Furthermore, it should be noted that this embodiment has a single Address Buffer block 12 instead of the split MSB, LSB Address Buffers 12, 14 of FIG. 11. Similarly, it requires only a single ATD Generator 18 instead of the MSB and LSB ATD Generators 18, 20 of FIG. 11. For the sake of functional clarity a number of refresh related circuits are left off of this embodiment.

During a write command addresses are being received. When the write command is completed the Addi block 24 generates a valid address internally and Write Driver block 58 drives the write (data in) data. The Row Decoder block 26 decodes valid internal addresses for Row(WL) selection and the Column Decoder block 28 decodes valid internal addresses for Column(CSL) selection. The Sensing control block 32 (not shown in this figure) generates BLSA (Bit Line Sense Amplifier) control signals and other related signals. The WL Generator block 54 enables the word line at the appropriate timing.

The S/A enable block 34 (not shown in this figure) generates the BLSA enable signal. A write operation is then performed. The delay circuit generates a delay time to provide a guaranteed cell restore. The End of restore (EOR) block 40 (not shown in this figure) generates the restore end signal which disables the word line generated by the WL Generator block 54 and signals from Sensing control block 32 (not shown in this figure) when the write operation is finished. After this the chip enters a stand-by mode.

5.6. Page Mode Cycle Timing with Refresh.

The following describes in greater detail aspects of the timing diagram of FIG. 10 illustrating page mode cycle timing and refresh.

Cycle 1 represents a normal cycle in which the address MSB and LSB of the address change. The word line is enabled and after some delay an end of restore signal is generated by End of Restore block 40 in response to output from Delay A Circuit block 36. The word line is disabled automatically by the end of restore signal. A refresh action can be performed in the remaining time. The page mode stand-by signal can be generated in response to the word line enable signal from WL Generator block 54.

When in a page cycle within Cycle 2 (only the address LSB changes) Page Mode On block 44 can be activated in response to LSB address information and the output of the Page Mode Stand-by block 42. The output of the Page Mode On block 44 can enable previous word line and control the End of Restore block 40 so it doesn't disable the word line.

If this is a normal cycle (MSB change) then Page Mode Stand-by block 42 is disabled. If the address is valid then cycle 1 action is followed.

In Cycle N comprising a normal cycle, having an MSB change the Page Mode Stand-by block 42 and the Page Mode On block 44 are disabled. The word line is disabled. If the address is valid then the action of cycle 1 is followed.

In Cycle N−1, if there was no prior activity then the output from Delay B Circuit block 38 enables the End of Restore block 40 and the word line is disabled.

It should be appreciated that the present invention provides a number of mechanisms for interfacing to dynamic RAM making it fully compatible with static RAM protocols. The memory devices according to the present invention can be utilized in applications without the need to adhere to the numerous operational restrictions inherent in 1T1C SRAM, thereby reducing complexity while increasing access speed.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A memory circuit having dynamic memory cells configured to simulate static memory, comprising:
   an array of dynamic memory cells;
   an internal address generating circuit configured for receiving address and command information and generating internal addresses;
   a decoder circuit for receiving said internal addresses and controlling access to said dynamic memory cells; and
   means for generating a word line output to said dynamic memory when triggered by said decoder circuit wherein said word line output is terminated in response to maximum cycle time (tRC) when in non-paged mode, or maximum page mode cycle time (tPMRC) when in page mode.

2. A memory circuit as recited in claim 1, wherein said dynamic memory cells comprise a single transistor and capacitor (1T1C) for each memory bit.

3. A memory circuit as recited in claim 1, further comprising means for comparing external address durations against an internal duration to detect invalid address durations and ignoring an operation associated with said invalid address duration.

4. A memory circuit as recited in claim 1, further comprising means for commencing a write operation following disabling of a write control signal.

5. A memory device, comprising:
   a plurality of dynamic random access memory (DRAM) cells; and
   an interface circuit coupled to said DRAM cells and having circuitry for performing read, write and refresh operations incorporating circuits configured for performing one or more of the following,
      pulsed operation of word lines in response to page and non-paged modes to provide refresh hiding,
      address duration comparison for ignoring operations associated with address of an invalid length,
      performing a write operation following disabling of a write control signal.

6. A memory device as recited in claim 5, wherein said interface circuit is configured for receiving address, data and control signals compatible with static random access memory (SRAM).

7. A memory circuit as recited in claim 5, wherein said dynamic memory cells comprise a single transistor and capacitor (1T1C) for each memory bit.

8. A memory device as recited in claim 5, wherein said interface circuit is configured for activating a word line with pulses or automatically shutting it down after a desired period of time.

9. A memory device as recited in claim 8, wherein said interface circuit is configured for disabling a word line pulse in page mode after the maximum page mode cycle time (tPMRC) is reached.

10. A memory device as recited in claim 8, wherein said interface circuit is configured for disabling a word line in response to a command or in response to receipt of a subsequent address.

11. A memory device as recited in claim 10, wherein said interface circuit is configured for disabling a word line at the next address if this occurs before maximum page mode cycle time (tPMRC) when in page mode.

12. A memory device as recited in claim 5, wherein said interface circuit is configured for performing said address duration comparison for detecting valid addresses and to allow accesses in which the address is available for at least the internal minimum tRC duration.

13. A memory device as recited in claim 12, wherein said address duration comparison is performed by a counter circuit.

14. A memory device, comprising:
   a plurality of dynamic random access memory (DRAM) cells;
   an interface circuit coupled to said DRAM cells and having circuitry for performing read, write and refresh operations; and
   address duration comparison circuitry configured for ignoring operations associated with addresses which are received of an invalid length.

15. A memory device as recited in claim 14, further comprising:
   a late write circuit configured for performing a write operation following disabling of a write control signal.

16. A memory device as recited in claim 14, further comprising:
   a word line generator circuit configured for generating pulses to operate the word lines in response to page and non-paged modes to provide refresh hiding.

17. A memory device as recited in claim 16, wherein said word line generator circuit is activated with pulses or automatically shut down after a desired period of time.

18. A memory device as recited in claim 17, wherein said word line generator circuit disables a word line pulse in page mode after the maximum page mode cycle time (tPMRC) is reached.

19. A memory device as recited in claim 14, wherein said dynamic memory cells comprise a single transistor and capacitor (1T1C) for each memory bit.

20. A memory device, comprising:
   a plurality of dynamic random access memory (DRAM) cells;
   an interface circuit coupled to said DRAM cells and having circuitry for performing read, write and refresh operations;
   a late write circuit configured for performing a write operation following disabling of a write control signal; and
   address duration comparison circuitry configured for ignoring operations associated with addresses which are received of an invalid length.

21. A memory device as recited in claim 20, further comprising:
   a word line generator circuit configured for generating pulses to operate word lines in response to page and non-paged modes to provide refresh hiding.

22. A memory circuit having dynamic memory cells configured to simulate static memory, comprising:
   an array of dynamic memory cells;
   an internal address generating circuit configured for receiving address and command information and generating internal addresses;
   a decoder circuit for receiving said internal addresses and controlling access to said dynamic memory cells; and
   a word line control circuit configured to output a word line to said dynamic memory when triggered by said decoder circuit wherein said word line is terminated in response to maximum cycle time (tRC) when in non-paged mode, or maximum page mode cycle time (tPMRC) when in page mode;

an address comparison circuit configured for comparing external address durations against an internal duration to detect invalid address durations and ignoring an operation associated with said invalid address duration; and a late writing circuit configured for commencing a write operation following disabling of a write control signal to said array of dynamic memory cells.

23. A memory circuit as recited in claim 22, wherein said dynamic memory cells comprise a single transistor and capacitor (1T1C) for each memory bit.

24. A memory device as recited in claim 22, wherein said word line control circuit is configured to be disabled in response to a command or in response to receipt of a subsequent address.

25. A memory device as recited in claim 24, wherein said word line control circuit is configured for being disabled at the next address if this occurs before maximum page mode cycle time (tPMRC) when in page mode.

26. A method of interfacing a plurality of dynamic random access memory cells to external address, data and write control signals, comprising:

pulsing a word line for accessing memory wherein other word lines are avallable for refresh operations;

enabling a word line for a given access in response to detecting that the duration of an external address signal is equal to or exceeds the minimum tRC cycle time; and commencing a write operation after the write control signals have been disabled.

27. A memory device, comprising:

a plurality of dynamic random access memory (DRAM) cells;

an interface circuit coupled to said DRAM cells and having circuitry for performing read, write and refresh operations;

a late write circuit configured for performing a write operation following disabling of a write control signal;

a word line generator circuit configured for generating pulses to operate word lines in response to page and non-paged modes to provide refresh hiding.

* * * * *

UNITED STATES PATENT AND TRADEMARK OFFICE
CERTIFICATE OF CORRECTION

PATENT NO. : 6,937,503 B2
APPLICATION NO. : 10/892522
DATED : August 30, 2005
INVENTOR(S) : Jeong-Duk Sohn Page 1 of 1

It is certified that error appears in the above-identified patent and that said Letters Patent is hereby corrected as shown below:

Col. 15, Line 49, in Claim 7, the word "circuit" should be replaced with --device--.

Col. 17, Line 15 & 19, in Claims 24 and 25, the first occurrence of the word "circuit" should be replaced with --device--.

Signed and Sealed this

Twenty-fourth Day of February, 2009

JOHN DOLL
*Acting Director of the United States Patent and Trademark Office*